United States Patent
Cowles

(10) Patent No.: US 9,614,496 B1
(45) Date of Patent: Apr. 4, 2017

(54) FILTER CIRCUITS WITH EMITTER FOLLOWER TRANSISTORS AND SERVO LOOPS

(71) Applicant: ANALOG DEVICES, INC., Norwood, MA (US)

(72) Inventor: John Cowles, Beaverton, OR (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/951,073

(22) Filed: Nov. 24, 2015

(51) Int. Cl.
*H03B 1/00* (2006.01)
*H03K 5/00* (2006.01)
*H04B 1/10* (2006.01)
*H03H 11/12* (2006.01)

(52) U.S. Cl.
CPC ..... *H03H 11/1213* (2013.01); *H03H 11/1204* (2013.01); *H03H 11/1291* (2013.01)

(58) Field of Classification Search
USPC .................................................. 327/524–602
See application file for complete search history.

(56) References Cited

U.S. PATENT DOCUMENTS

| | | | | | |
|---|---|---|---|---|---|
| 3,518,563 | A | * | 6/1970 | Ainsworth | G11C 27/026 327/141 |
| 4,877,979 | A | * | 10/1989 | Sempel | H03H 11/34 327/555 |
| 5,293,087 | A | * | 3/1994 | Hamano | H03H 11/1213 327/558 |
| 6,225,859 | B1 | * | 5/2001 | Irvine | H03H 11/04 327/552 |
| 7,375,583 | B2 | * | 5/2008 | Ohannaidh | H03H 11/1213 327/552 |
| 8,067,931 | B2 | * | 11/2011 | Tran | G11O 5/145 323/315 |
| 2005/0189987 | A1 | * | 9/2005 | Ohannaidh | H03H 11/126 327/556 |

OTHER PUBLICATIONS

In-Young Lee et al., "A 50-450 MHz Tunable RF Biquad Filter Based on a Wideband Source Follower with > 26 dBm IIP3, + 12 dBm P1dB, and 15 dB Noise Figure,"IEEE Journal of Solid-State Circuits, vol. 50, No. 10, Oct. 2015, pp. 2294-2305.

* cited by examiner

Primary Examiner — Brandon S Cole
(74) Attorney, Agent, or Firm — Patent Capital Group

(57) ABSTRACT

Filter circuits with emitter follower transistors and servo loops, and associated methods and apparatuses, are disclosed herein. In some embodiments, a filter circuit may include: a resistor-capacitor network having an input to receive an input signal; an emitter follower transistor, coupled to the resistor-capacitor network, wherein the filter circuit has an output to provide an output signal from the emitter of the emitter follower transistor; a current source to provide a constant reference current; and a current-buffering servo loop circuit, coupled to the emitter follower transistor and the current source, including a current buffer and a controlled current sink to maintain the collector current and the emitter current of the emitter follower transistor equal to the constant reference current.

25 Claims, 13 Drawing Sheets

FILTER CIRCUITS WITH EMITTER FOLLOWER TRANSISTORS AND SERVO LOOPS

TECHNICAL FIELD

The present disclosure relates generally to filter circuits, and more particularly, to filter circuits with emitter follower transistors and current-buffering servo loops.

BACKGROUND

Circuit designers typically select from conventional filter circuit topologies when building a filter for an electronics application. One example of such topologies are the Sallen-Key filters, which ideally provide a flat gain response in the passband, and can be cascaded to increase the level of rejection in the stopband.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Disclosed herein are filter circuits with emitter follower transistors and servo loops, and associated methods and apparatuses. In some embodiments, a filter circuit may include: a resistor-capacitor network having an input to receive an input signal; an emitter follower transistor, coupled to the resistor-capacitor network, wherein the filter circuit has an output to provide an output signal from the emitter of the emitter follower transistor; a current source to provide a constant reference current; and a current-buffering servo loop circuit, coupled to the emitter follower transistor and the current source, including a current buffer and a controlled current sink to maintain the collector current and the emitter current of the emitter follower transistor equal to the constant reference current.

Nearly all electronics applications include analog filtering circuitry. While fully passive filters (using resistors, capacitors, and inductors) may generally offer the "best" signal dynamic range as represented by noise and distortion metrics, and may not actively consume power, fully passive filters take up a large volume in modern integrated circuit (IC) devices, and are too "bulky" to include in IC devices for frequencies approaching 1 GHz. Additionally, the attributes of fully passive filters are "fixed," and thus are not readily made programmable by swapping in capacitors and/or resistors with different values.

For applications that require programmable filters, conventional active filters (e.g., operational amplifiers and transconductance amplifiers) have conventionally been used. For example, Sallen-Key topologies, as noted above, represent a class of conventional active filters. However, such conventional active filters are typically limited in dynamic range and in the range of frequencies that can be handled. Moreover, speed limitations and the power consumption required by the active elements in these conventional active filters has limited these filters to lower frequency operation (e.g., a gain bandwidth product of 1-2 GHz, with 100-200 MHz of useful bandwidth).

Figures 1, 2:
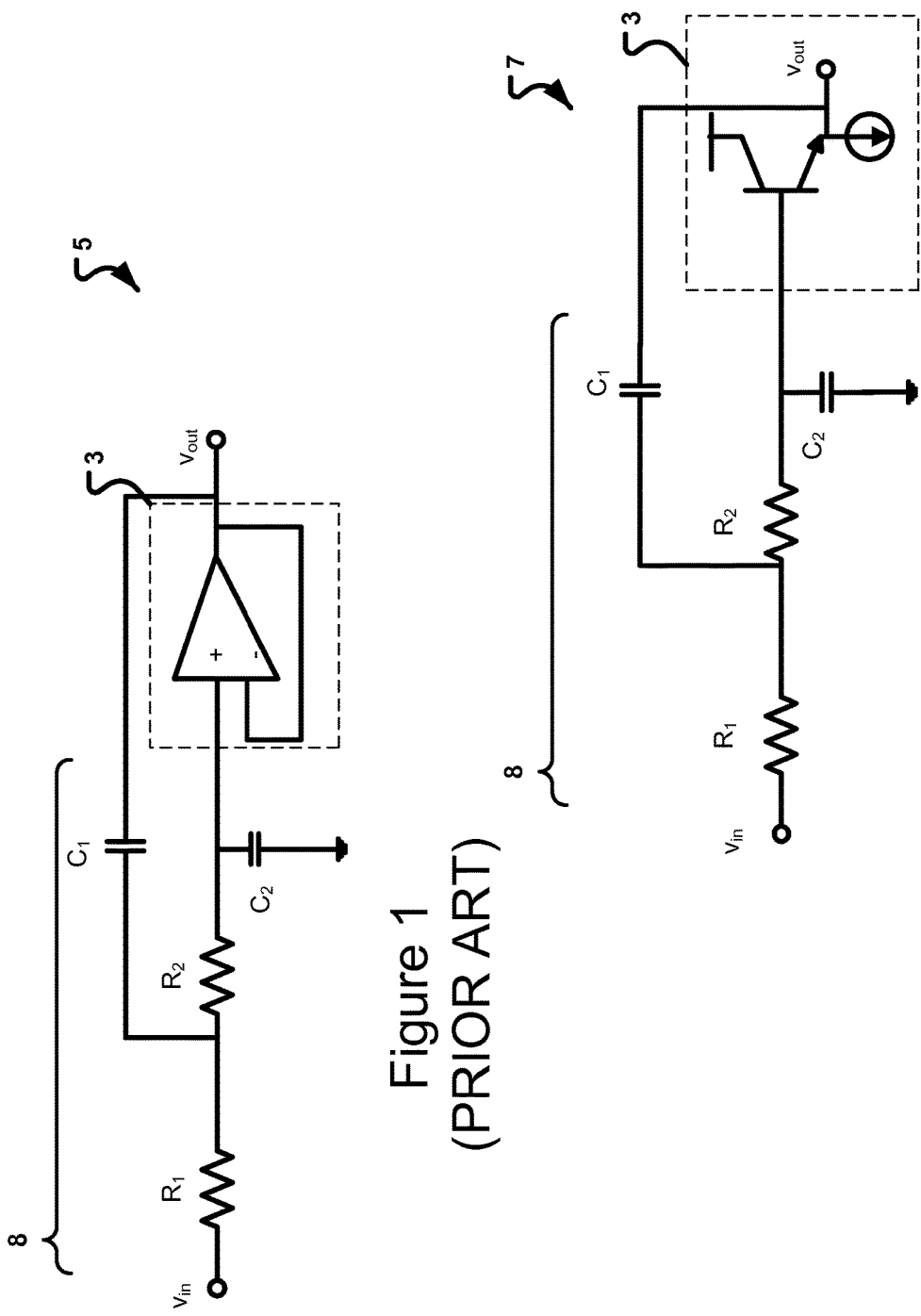
FIGS. 1 and 2 illustrate conventional Sallen-Key low-pass filters.

For example, FIG. 1 illustrates a conventional low-pass Sallen-Key bi-quadratic (biquad) filter 5 including a resistor-capacitor network 8 and a unity gain operational amplifier as the active component 3. The conventional filter 5 may be conventionally limited to less than 10% of the gain bandwidth product of the operational amplifier, which may in turn be limited by circuit parasitics and the compensation scheme used to avoid oscillation between the active component 3 (the operational amplifier) and the resistor-capacitor network 8. For example, parasitics in the transistors, capacitors, resistors, and metal interconnections may limit the gain bandwidth product of the Sallen-Key biquad filter 5 while maintaining stability, which may in turn limit the useful frequency range of the filter. When the Sallen-Key biquad filter 5 of FIG. 1 is reconfigured as a high-pass filter (e.g., as discussed below with reference to FIG. 16), the "high-pass" nature of the filter is limited by the frequency limitations of the unity gain operational amplifier (the active component 3), limiting the passband of the filter.

FIG. 2 illustrates a conventional low-pass Sallen-Key biquad filter 7 including the resistor-capacitor network 8 and an emitter follower transistor as the active component 3. The conventional filter 7, however, typically exhibits distortion of the corner frequency and the stopband because of the finite output impedance and input-to-output capacitance. In particular, the finite output impedance of the emitter follower transistor (the active component 3) and the unwanted capacitance that connects the input and output connections of the emitter follower transistor may cause the corner frequency and stopband to not behave as desired, and may even degrade the gain in the passband to attenuate the input signal.

Various ones of the filter circuits disclosed herein may improve on conventional Sallen-Key filters by exhibiting lower noise and power consumption while achieving good linearity and stopband performance. The filter circuits disclosed herein may selectively transmit and reject signals more effectively, without introducing errors, then conventional filter circuits. This improved filtering performance may reduce the performance requirements of subsequent signal processing blocks, such as analog-to-digital converters, enabling an overall improvement in the signal chain without increasing cost and complexity.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

Although the transistors illustrated in the accompanying drawings, and discussed herein, are particular bipolar junction transistors (BJTs), this is simply for ease of illustration, and the teachings of the present disclosure are readily applied by one of skill in the art to the use of PNP transistors in the place of NPN transistors (and vice versa) and to the use of metal oxide field effect transistors (MOSFETs) (e.g., with NMOS transistors in the place of NPN transistors, or PMOS transistors in the place of PNP transistors), as desired.

Figure 3:
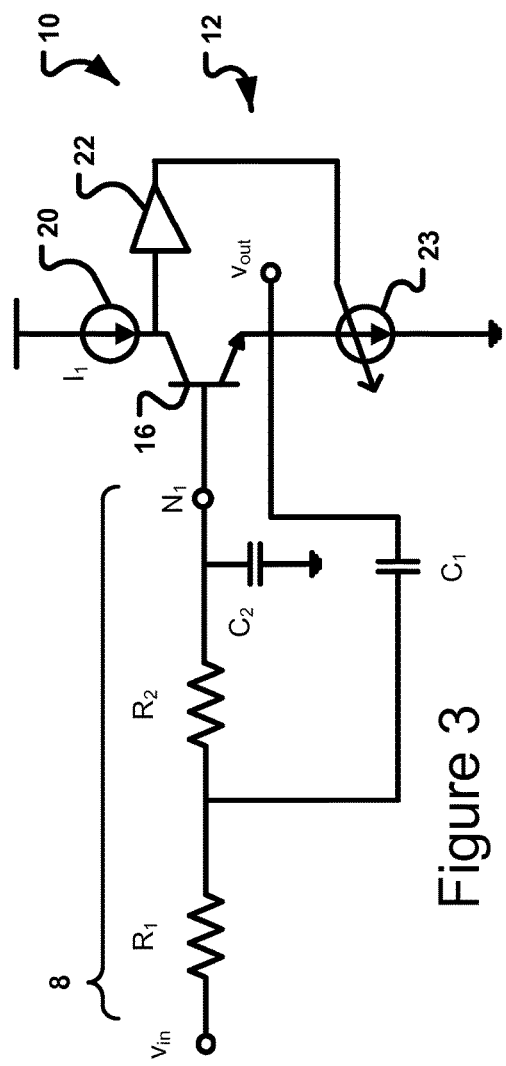
FIG. 3 illustrates a low-pass filter circuit having an emitter follower transistor and a current-buffering servo loop circuit, in accordance with various embodiments.

FIG. 3 illustrates a filter circuit 10 having an emitter follower transistor 16 and a current-buffering servo loop circuit 12, in accordance with various embodiments. In particular, the emitter follower transistor 16 may be coupled to a resistor-capacitor network 8 that includes resistors $R_1$ and $R_2$, capacitors $C_1$ and $C_2$, and has an input $v_{in}$ to receive an input signal. A node $N_1$ of the resistor capacitor network 8 may be coupled to a base of the emitter follower transistor 16, and the capacitor $C_1$ may be coupled to the emitter of the emitter follower transistor 16, as shown in FIG. 3.

The resistor-capacitor network 8 may have a Sallen-Key topology, as illustrated and as known in the art. In particular, the resistor-capacitor network 8 illustrated in FIG. 3 is an example of a second-order, active, biquad, low-pass topology. The stopband of the filter circuit 10 may be characterized by its level of rejection relative to the passband; for second-order filters, the rejection ideally doubles for every doubling of the frequency in the stopband. Higher-order filters may offer a steeper roll off than lower-order filters, and thus in some embodiments, multiple stages of second-order filters (e.g., the second-order filter illustrated in FIG. 3) may be cascaded to achieve improved stopband suppression (e.g., as discussed below with reference to FIG. 13). A particular roll-off and overall filter corner for the filter circuit 10 may depend on the corner frequency $\omega_0$ and quality factor Q of the filter circuit 10, and the corner frequency $\omega 0$ and the quality factor Q may be specified by the appropriate choice of the values of the resistors and capacitors of the resistor-capacitor network 8, as known in the art.

The collector of the emitter follower transistor 16 may have a collector current, and the emitter of the emitter follower transistor 16 may have an emitter current. The filter circuit 10 may have an output $v_{out}$ to provide an output signal from the emitter of the emitter follower transistor 16.

The filter circuit 10 may further include a current source 20 to provide a constant reference current $I_1$. As shown in FIG. 3, the current source 20 may be coupled to the collector of the emitter follower transistor 16.

The current-buffering servo loop circuit 12 may be coupled to the emitter follower transistor 16 and the current source 20. As shown in FIG. 3, the servo loop circuit 12 may be coupled to the current source 20 and the emitter of the emitter follower transistor 16. The servo loop circuit 12 may include a current buffer 22 and a controlled current sink 23. The current buffer 22 may be coupled between the current source 20 and the controlled current sink 23, and the controlled current sink 23 may be coupled to the emitter of the emitter follower transistor 16.

The current-buffering servo loop circuit 12 may be configured to maintain the collector current and emitter current of the emitter follower transistor 16 equal to the constant reference current provided by the current source 20 ($I_1$ of FIG. 3). In particular, the current-buffering servo loop circuit 12 may maintain the collector current and the emitter current of the emitter follower transistor 16 equal to the constant reference current provided by the current source 20 when a load is coupled to the output $v_{out}$ and draws a (potentially variable) load current from the filter circuit 10. The servo loop circuit 12 may perform this control by sensing the voltage at the collector of the emitter follower transistor 16 (representative of the collector current and the emitter current of the emitter follower transistor 16), and adjusting the current drawn by the controlled current sink 23 dynamically to maintain the collector current and the emitter current of the emitter follower transistor 16 equal to the constant reference current provided by the current source 20.

Maintaining the operating conditions of the emitter follower transistor 16 may preserve the operational characteristics of the emitter follower transistor 16, causing the operation of the emitter follower transistor 16 to more closely adhere to "ideal follower" performance and enabling the voltage at the output $v_{out}$ to consistently and accurately track the voltage at the node $N_1$. Without the control provided by the current-buffering servo loop circuit 12, the emitter and/or collector current of the emitter follower transistor 16 may change as the load current changes, changing the operational characteristics of the emitter follower transistor 16, and thus changing the relationship between the voltage at the base of the emitter follower transistor 16 and the voltage at the output $v_{out}$. The current-buffering servo loop circuit 12 may also makes the effective impedance of the filter circuit 10 orders of magnitude lower than the conventional filters discussed above with reference to FIGS. 1 and 2, which may also reduce the impact of stray capacitance on the performance of the filter circuit 10. Particular embodiments of the current-buffering servo loop circuit 12 and its operation are discussed in further detail herein.

Figure 4:
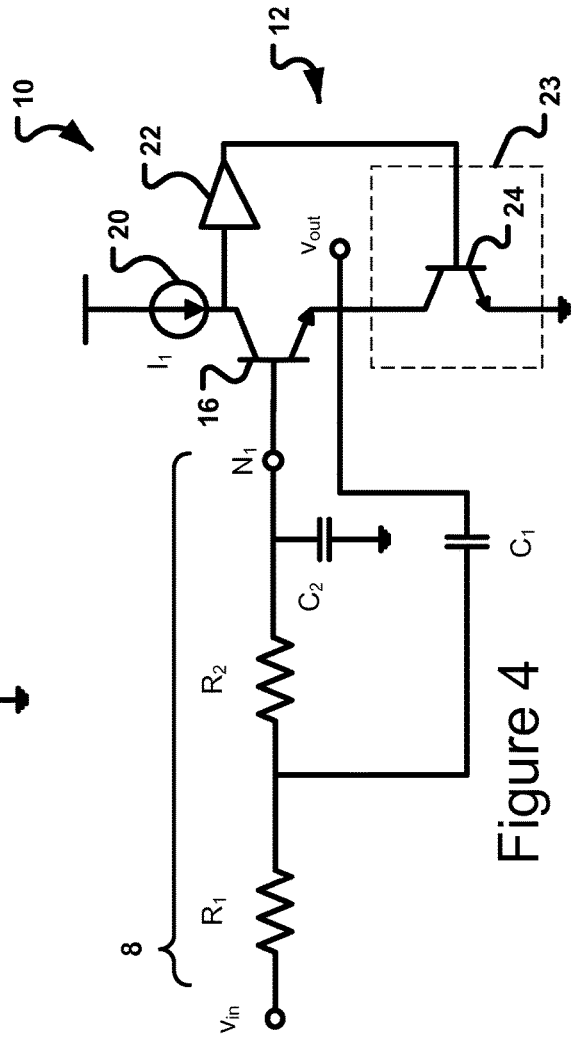
FIGS. 4-12 illustrate various embodiments of the filter circuit of FIG. 3.

FIGS. 4-12 illustrate various embodiments of the filter circuit 10 of FIG. 3. For example, FIG. 4 illustrates an embodiment of the filter circuit 10 of FIG. 3 in which the controlled current sink 23 of the current-buffering servo loop circuit 12 includes a common emitter transistor 24. As illustrated in FIG. 4, the collector of the common emitter transistor 24 may be coupled to the emitter of the emitter follower transistor 16, and the base of the common emitter transistor 24 may be coupled to the current buffer 22. In other embodiments, the controlled current sink 23 of the servo loop circuit 12 may not take the form illustrated in FIG. 4, but may instead include a degeneration resistor coupled between the emitter of the common emitter transistor 24 and ground, a cascoded current sink (as known in the art), or any other suitable form.

Figure 5:
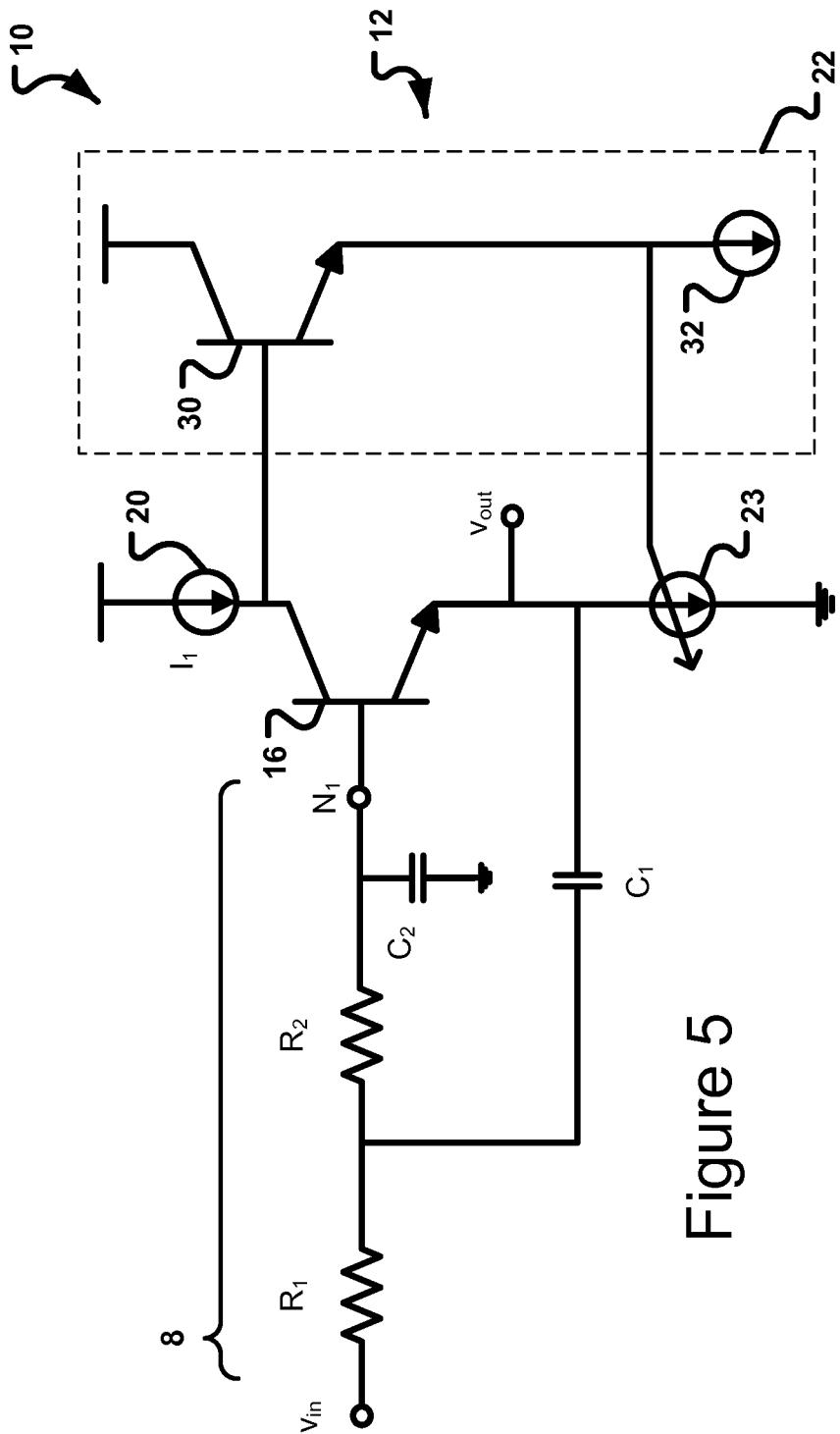

FIG. 5 illustrates an embodiment of the filter circuit 10 of FIG. 3 in which the current buffer 22 of the current-buffering servo loop circuit 12 is an emitter follower buffer. The emitter follower buffer 22 illustrated in FIG. 5 includes an emitter follower transistor 30 and a current sink 32; the emitter follower transistor 30 may be coupled between the current source 20 and the current sink 32, and the current sink 32 may be coupled to the controlled current sink 23. The current sink 32 may take any suitable form; for example, in some embodiments, the current sink 32 may be implemented by a resistor coupled to ground. The emitter follower buffer 22 illustrated in FIG. 5 is illustrative, and other emitter follower buffer arrangements may be used (e.g., having multiple ones of the emitter follower buffer 22 in series to provide more current gain and to mitigate any loading of the current source 20).

Figure 6:
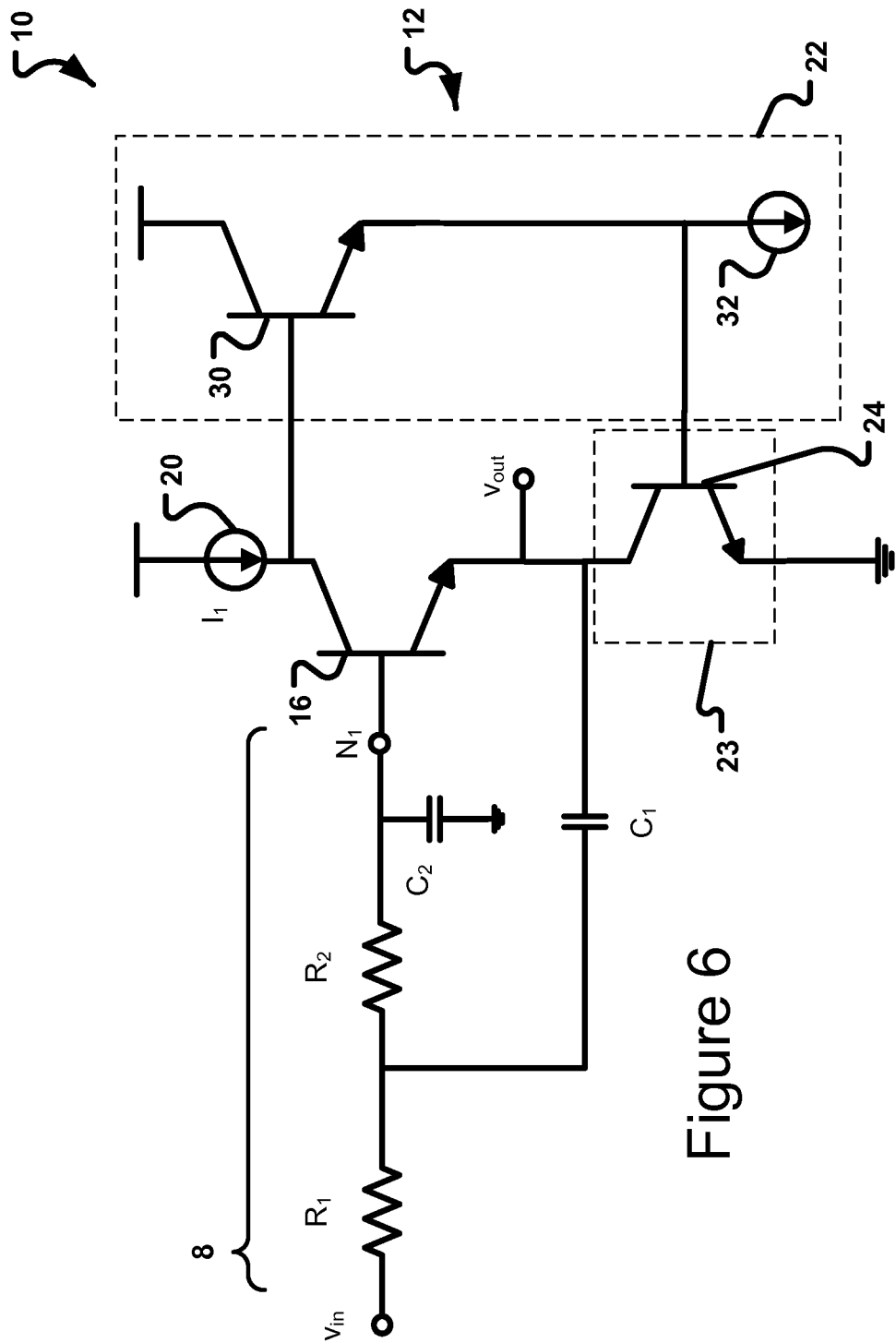

FIG. 6 illustrates an embodiment of the filter circuit 10 of FIG. 5 in which the controlled current sink 23 of the current-buffering servo loop circuit 12 includes a common emitter transistor 24. As illustrated in FIG. 6, the collector of the common emitter transistor 24 may be coupled to the emitter of the emitter follower transistor 16, and the base of the common emitter transistor 24 may be coupled to the emitter follower buffer 22. In particular, the base of the common emitter transistor 24 may be coupled to the current sink 32/emitter of the emitter follower transistor 30, as shown. In other embodiments, the controlled current sink 23 of the servo loop circuit 12 may not take the form illustrated in FIG. 6, but may instead include a degeneration resistor coupled between the emitter of the common emitter transistor 24 and ground, a cascoded current sink (as known in the art), or any other suitable form (as discussed above with reference to FIG. 4).

Figure 7:
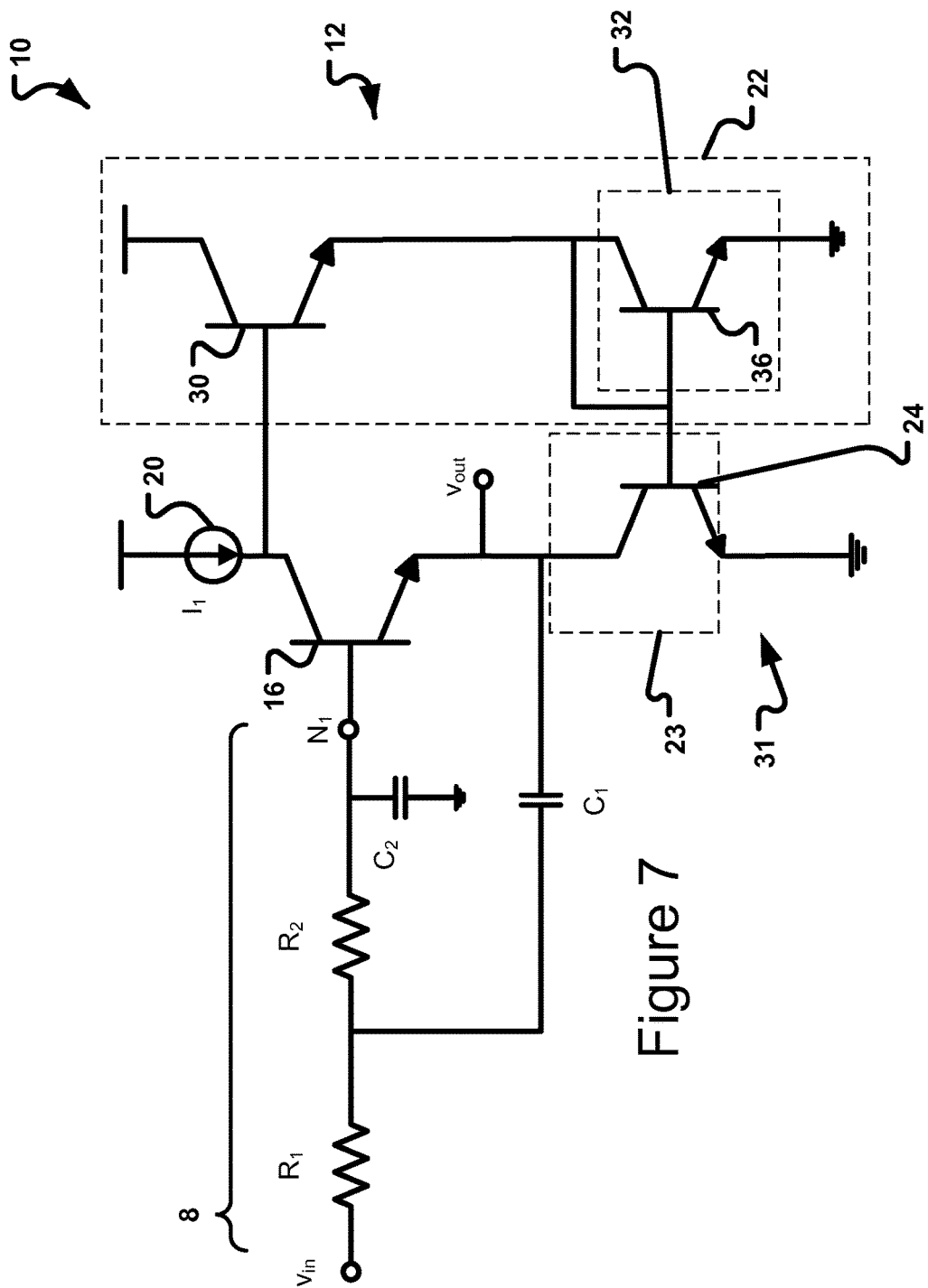

FIG. 7 illustrates an embodiment of the filter circuit 10 of FIG. 5 in which the controlled current sink 23 and the current sink 32 are parts of a current mirror 31. In particular, the controlled current sink 23 may include the common emitter transistor 24, and the current sink 32 may include the transistor 36; in the current mirror 31, the bases of the common emitter transistor 24 and the transistor 36 may be coupled together, and the collector of the transistor 36 may be coupled to the base of the transistor 36, as illustrated. As known in the art, the collector currents of the common emitter transistor 24 and the transistor 36 in a current mirror configuration will depend on the relative sizes of the common emitter transistor 24 and the transistor 36. For example, if the common emitter transistor 24 and the transistor 36 have approximately the same physical characteristics, the collector currents of the common emitter transistor 24 and the transistor 36 will be approximately the same. In another example, if the common emitter transistor 24 is N times larger than the transistor 36, the collector current of the common emitter transistor 24 will be approximately N times larger than the collector current of the transistor 36. In the configuration of FIG. 7, the collector current of the transistor 36 will also be the same as the emitter current of the emitter follower transistor 30.

Figure 8:
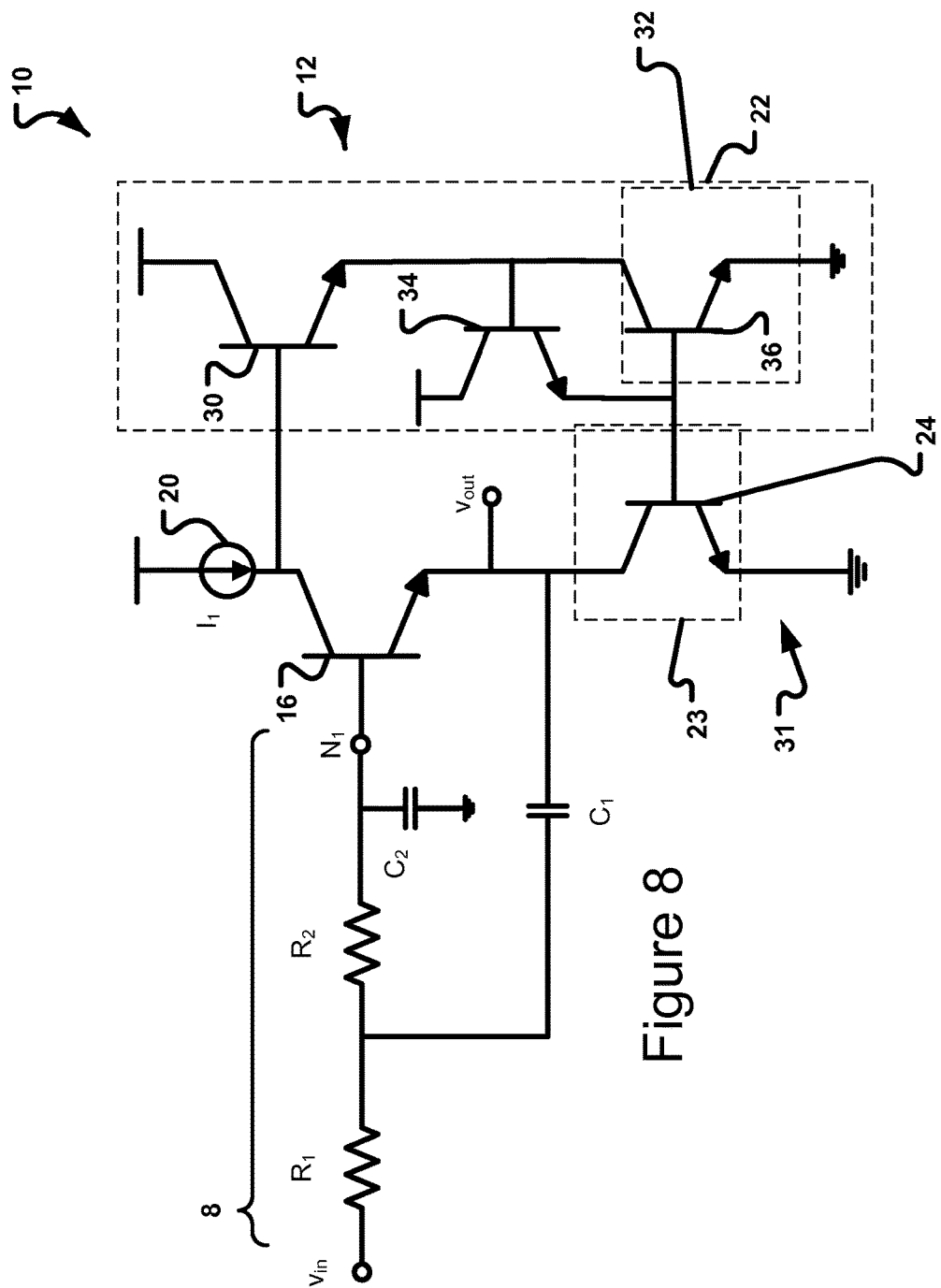

FIG. 8 illustrates a variation of the filter circuit 10 of FIG. 7 in which the current mirror 31 further includes an additional "helper" transistor 34 coupled between the collector and base of the transistor 36. In particular, as shown in FIG. 8, the base of the transistor 34 may be coupled to the collector of the transistor 36, and the emitter of the transistor 34 may be coupled to the base of the transistor 36 (and the base of the common emitter transistor 24). The transistor 34 may improve the drive capability of the current mirror 31, at the cost of an increase in complexity relative to the embodiment of FIG. 7. In particular, the transistor 34 may supply all of the base current for the common emitter transistor 24 and the transistor 36, reducing the current loss reflected back to the base of the emitter follower transistor 30. Any current variation at the base of the emitter follower transistor 30 may result in undesirable variation in the collector current of the emitter follower transistor 16; the transistor 34 may aid in limiting this undesirable behavior.

Figure 9:
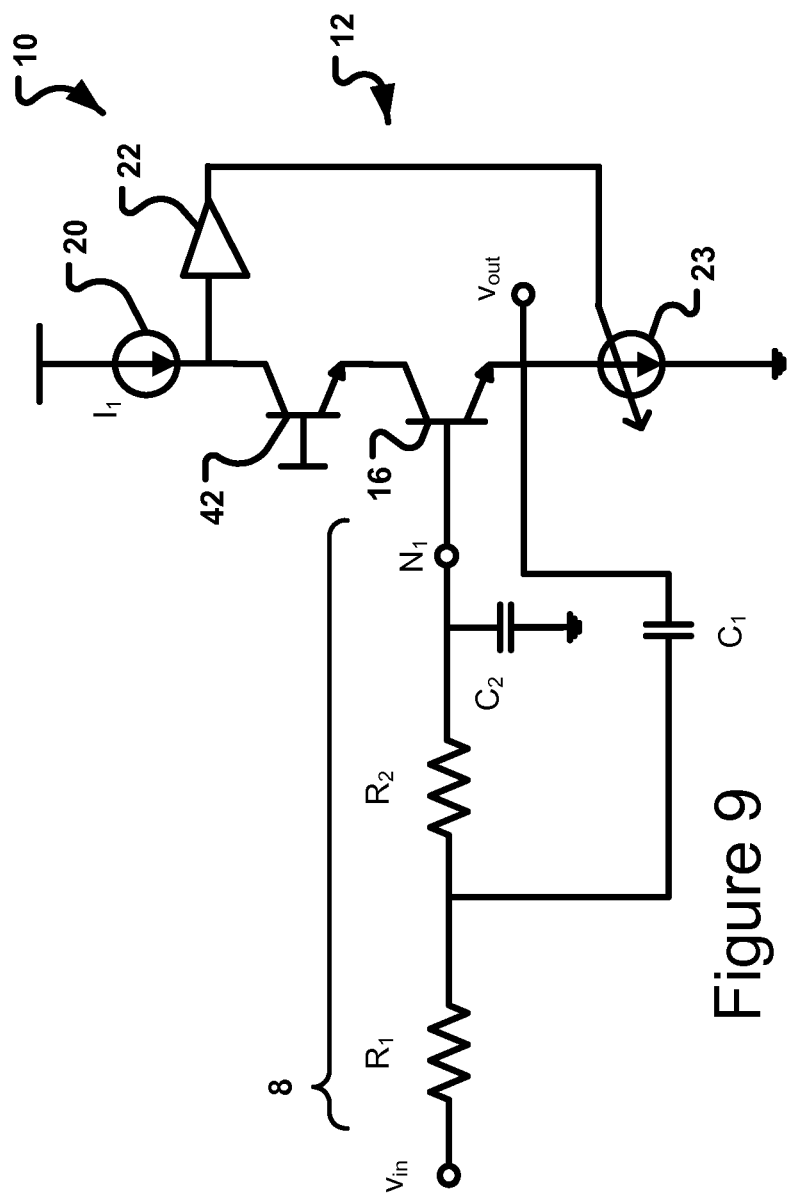

FIG. 9 illustrates an embodiment of the filter circuit 10 of FIG. 3 in which the current-buffering servo loop circuit 12 includes a cascode transistor 42 coupled between the current source 20 and the emitter follower transistor 16. The cascode transistor 42 may be biased in any suitable manner, as known in the art. The cascode transistor 42 may be included in any of the embodiments of the servo loop circuit 12 of the filter circuit 10 discussed above with reference to FIGS. 4-7 or below with reference to FIGS. 10-12. The cascode transistor 42 may advantageously increase the output impedance seen by the current source 20, which may in turn make the loop gain around the emitter follower transistor 16 larger and make the behavior of the emitter follower transistor 16 closer to "ideal." Additionally, the cascode transistor 42 may minimize the Miller multiplication of the capacitance from the base to the collector of the emitter follower transistor 16, improving the bandwidth of the filter circuit 10. The cascode transistor 42 may impose the "costs" of additional supply headroom to accommodate the voltage drop across the cascode transistor 42, and another bias for the base of the cascode transistor 42.

Figure 10:
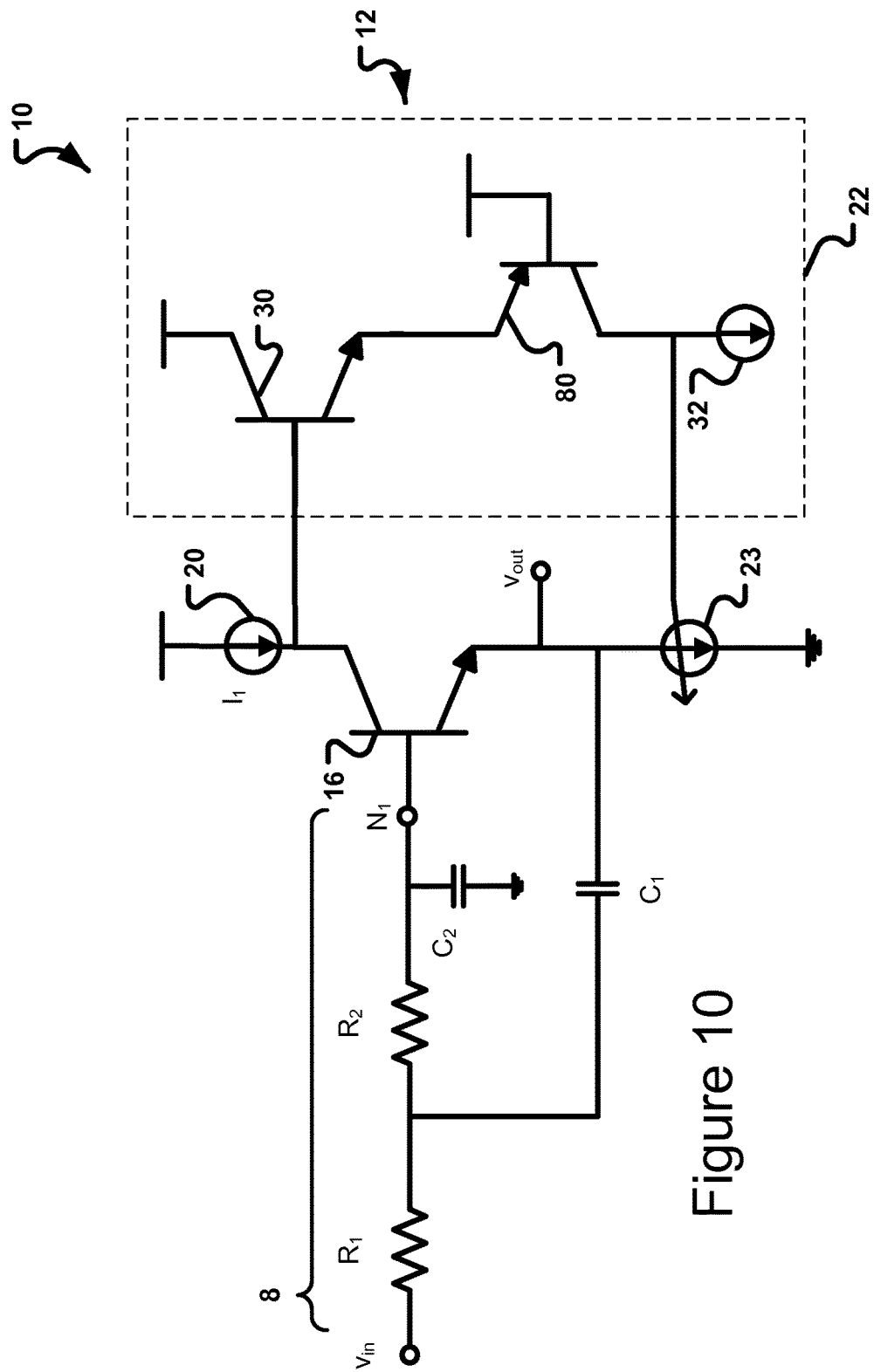

FIG. 10 illustrates a variation of the filter circuit 10 of FIG. 5 in which the current buffer 22 of the current-buffering servo loop circuit 12 further includes a voltage buffer that, in FIG. 10, takes the form of a common base transistor 80. In some embodiments, as illustrated in FIG. 10, the emitter follower transistor 30 may be coupled between the current source 20 and the common base transistor 80. In particular, the base of the emitter follower transistor 30 may be coupled to the current source 20, and the emitter of the emitter follower transistor 30 may be coupled to the emitter of the common base transistor 80. The common base transistor 80 of FIG. 10 may provide voltage buffering to the current-buffering servo loop circuit 12, which may improve the speed with which the current-buffering servo loop circuit 12 can respond to changes in the collector voltage by adjusting the current drawn by the controlled current sink 23. The current sink 32 and the controlled current sink 23 of the embodiment of FIG. 10 may take the form of any of the embodiments discussed above with reference to FIGS. 6-8 (e.g., a common emitter transistor for the controlled current sink 23, a current mirror for the controlled current sink 23 and the current sink 32, etc.).

Figure 11:
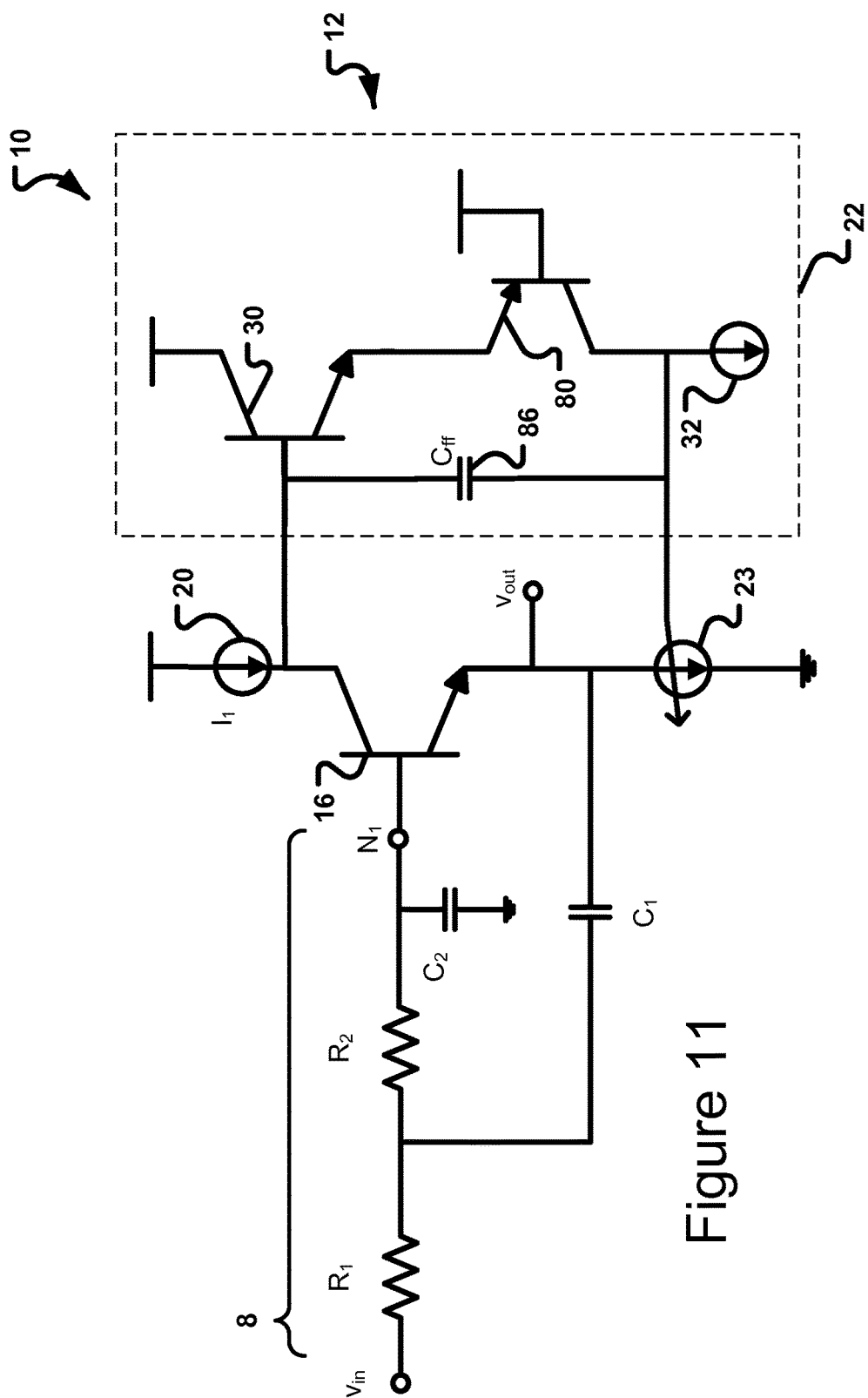

FIG. 11 illustrates a variation of the filter circuit 10 of FIG. 10 in which a "feedforward" capacitor 86 (labeled CFF in FIG. 11) is coupled between the current source 20 and the current sink 32. The capacitor 86 may mitigate the reduced bandwidth associated with a high gain current-buffering servo loop circuit 12 (e.g., as may arise from the use of the common base transistor 80) by providing a signal path "around" the common base transistor 80 for high frequency signals. The current sink 32 and the controlled current sink 23 of the embodiment of FIG. 11 may take the form of any of the embodiments discussed above with reference to FIGS. 6-8 (e.g., a common emitter transistor for the controlled current sink 23, a current mirror for the controlled current sink 23 and the current sink 32, etc.).

In some embodiments, the filter circuit 10 may be included in a differential configuration. For example, the input $v_{in}$ of the filter circuit 10 of FIG. 3 may receive a differential input, and the output $v_{out}$ of the filter circuit 10 of FIG. 3 may provide a differential output. In some such configurations, the filter circuit 10 may include two "copies" of the circuitry illustrated in FIG. 3, with one "copy" filtering the positive input signal and providing the positive output signal, and the other "copy" filtering the negative input signal and providing the negative output signal.

Figure 12:
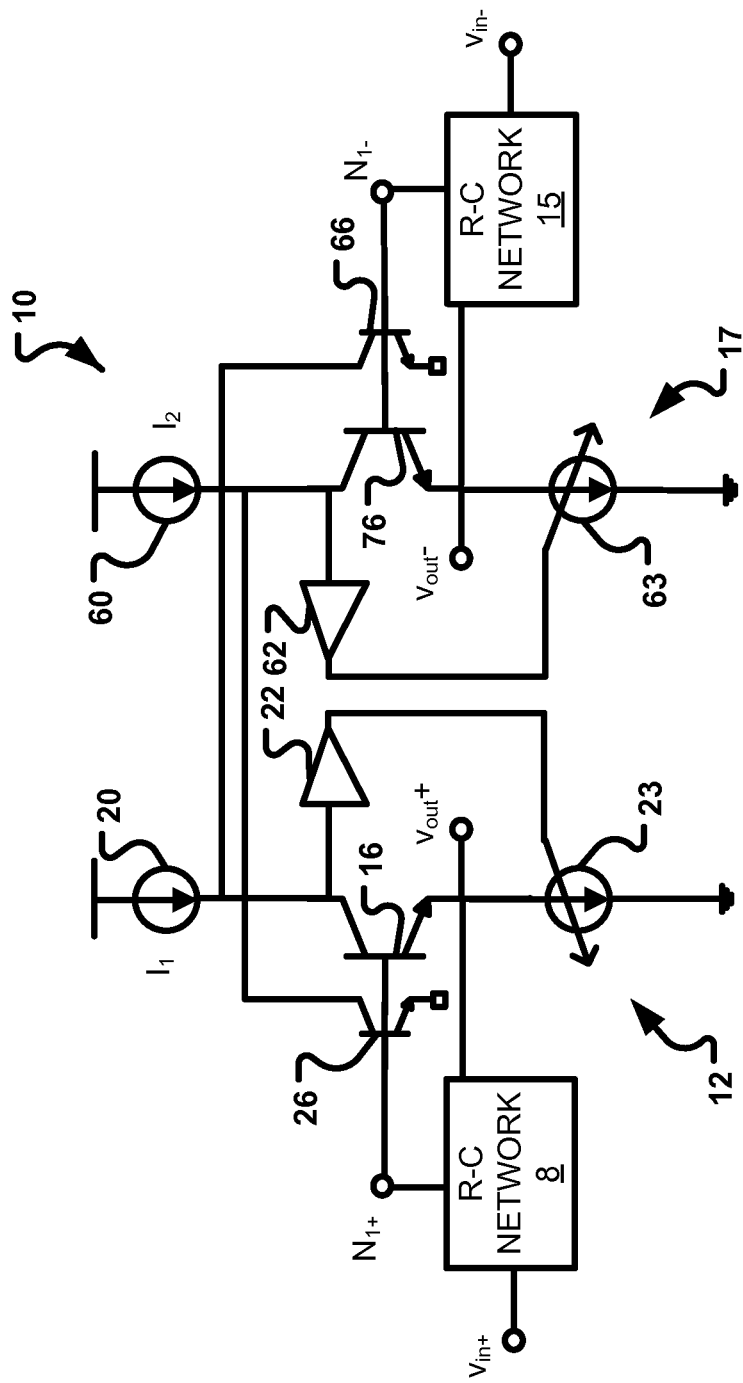

FIG. 12 illustrates an embodiment of a differential implementation of the filter circuit 10. The filter circuit 10 may include a first emitter follower transistor 16 and a first current-buffering servo loop circuit 12, as well as a second emitter follower transistor 76 and a second current-buffering servo loop circuit 17. The first emitter follower transistor 16 may be coupled to a first resistor-capacitor network 8 with a positive input $v_{in+}$ to receive a positive differential input signal; the first resistor-capacitor network 8 of FIG. 12 may take the form of any of the resistor-capacitor networks 8 disclosed herein. In particular, a node $N_{1+}$ of the first resistor capacitor network 8 may be coupled to a base of the first emitter follower transistor 16. The filter circuit 10 may have a positive output $v_{out+}$ to provide a positive differential output signal from the emitter of the first emitter follower transistor 16.

The filter circuit 10 of FIG. 12 may further include a first current source 20 to provide a constant reference current $I_1$. As shown in FIG. 12, the first current source 20 may be coupled to the collector of the first emitter follower transistor 16. The first servo loop circuit 12 may be coupled to the first emitter follower transistor 16 and the first current source 20; as shown in FIG. 12, the first current-buffering servo loop circuit 12 may be coupled to the first current source 20 and the emitter of the first emitter follower transistor 16. The first current-buffering servo loop circuit 12 may include a first current buffer 22 and a first controlled current sink 23. The first current buffer 22 may be coupled between the first current source 20 and the first controlled current sink 23, and the first controlled current sink 23 may be coupled to the emitter of the first emitter follower transistor 16. The first current buffer 22 and the first controlled current sink 23 may take any of the forms discussed herein with reference to FIGS. 4-11.

The second emitter follower transistor 76 may be coupled to a second resistor-capacitor network 15 with a negative input $v_{in-}$ to receive a negative differential input signal; the second resistor-capacitor network 15 of FIG. 12 may take the form of any of the resistor-capacitor networks 8 disclosed herein. In particular, a node $N_{1-}$ of the second resistor capacitor network 15 may be coupled to a base of the second emitter follower transistor 76. The filter circuit 10 may have a negative output $v_{out-}$ to provide a negative differential output signal from the emitter of the second emitter follower transistor 76.

Figure 13:
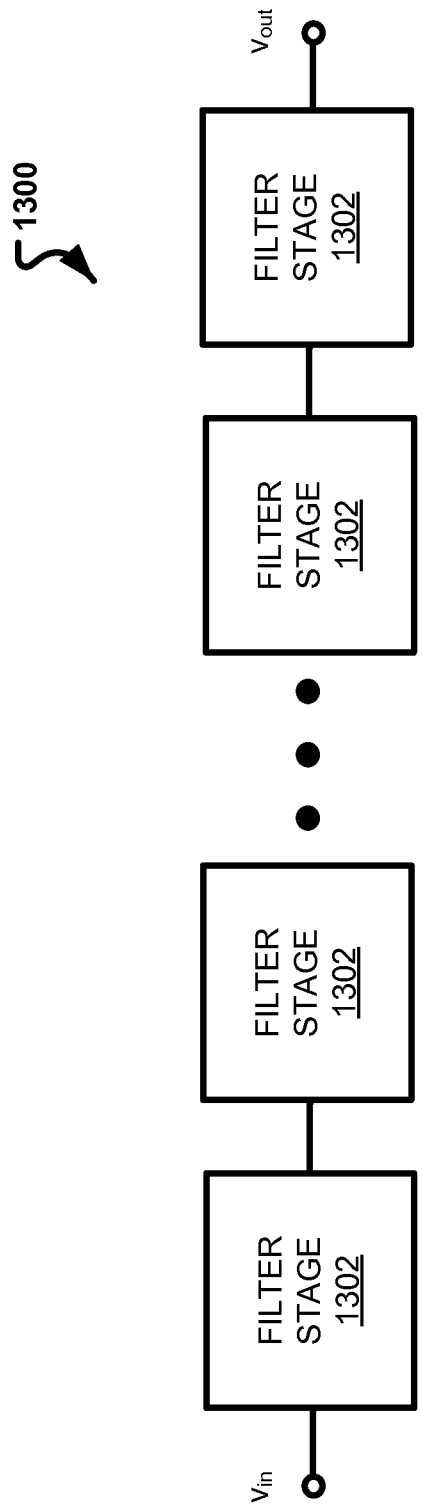
FIG. 13 is a block diagram of a multi-stage filter that may include the filter circuit of FIG. 3, in accordance with various embodiments.

The filter circuit 10 of FIG. 12 may further include a second current source 60 to provide a constant reference current $I_2$. As shown in FIG. 13, the second current source 60 may be coupled to the collector of the second emitter follower transistor 76. The second current-buffering servo loop circuit 17 may be coupled to the second emitter follower transistor 76 and the second current source 60; as shown in FIG. 13, the second current-buffering servo loop circuit 17 may be coupled to the second current source 60 and the emitter of the second emitter follower transistor 76. The second current-buffering servo loop circuit 17 may include a second current buffer 62 and a second controlled current sink 63. The second buffer 62 may be coupled between the second current source 60 and the second controlled current sink 63, and the second controlled current sink 63 may be coupled to the emitter of the second emitter follower transistor 76. The second current buffer 62 and the second controlled current sink 63 may take any of the forms discussed herein with reference to FIGS. 4-11. In some embodiments, the first current buffer 22 may have the same configuration as the second current buffer 62, and the first controlled current sink 23 may have the same configuration as the second controlled current sink 63.

As discussed above with reference to FIG. 3, the first current-buffering servo loop circuit 12 may be configured to maintain the collector current and emitter current of the first emitter follower transistor 16 equal to the constant reference current provided by the first current source 20, and the second current-buffering servo loop circuit 17 may be configured to maintain the collector current and emitter current of the second emitter follower transistor 76 equal to the constant reference current provided by the second current source 60. In particular, the current-buffering servo loop circuits 12 and 17 may maintain the collector currents and the emitter currents of the emitter follower transistors 16 and 76, respectively, equal to the constant reference currents provided by the current sources 20 and 60, respectively, when a load is coupled to the output $v_{out+}/v_{out-}$ and draws a (potentially variable) load current from the filter circuit 10.

The filter circuit 10 may further include cross-coupling between the positive and negative differential components. For example, the filter circuit 10 of FIG. 12 may include a transistor 26 having its base coupled to the base of the first emitter follower transistor 16 and having its collector coupled to the collector of the second emitter follower transistor 76. The filter circuit 10 of FIG. 12 may also include a transistor 66 having its base coupled to the base of the second emitter follower transistor 76, and having its collector coupled to the collector of the first emitter follower transistor 26. As shown in FIG. 13, the emitters of the transistors 26 and 66 may be left floating, and the transistors 26 and 66 may act as capacitors in coupling the positive and negative differential components. This may "neutralize" the Miller capacitance (as discussed above with reference to FIG. 9) by sending equivalent feedforward currents to cancel those that occur in the emitter follower transistors 16 and 76. This implementation may be advantageously applied to differential topologies, in lieu of a cascode transistor as discussed above with reference to FIG. 9, in some embodiments.

In some embodiments, the filter circuits 10 disclosed herein may be cascaded to form multiple stages of a multi-stage filter. For example, FIG. 13 is a block diagram of a multi-stage filter 1300 that may include the filter circuit 10 of FIG. 3 in any of the filter stages 1302, in accordance with various embodiments. In particular, one or more of the filter stages 1302 may include a resistor having a resistor-capacitor network 8 having a Sallen-Key topology (e.g., a unity-gain amplifier Sallen-Key topology). The filter stages 1302 may be arranged in series, as shown, and any number of them may be included in a multi-stage filter 1300. The number of filter stages 1302 may be selected based on the amount of rejection desired at some frequency offset from the filter corner, tolerable ripple, desired phase response, and other filter parameters as known in the art.

Figure 14:
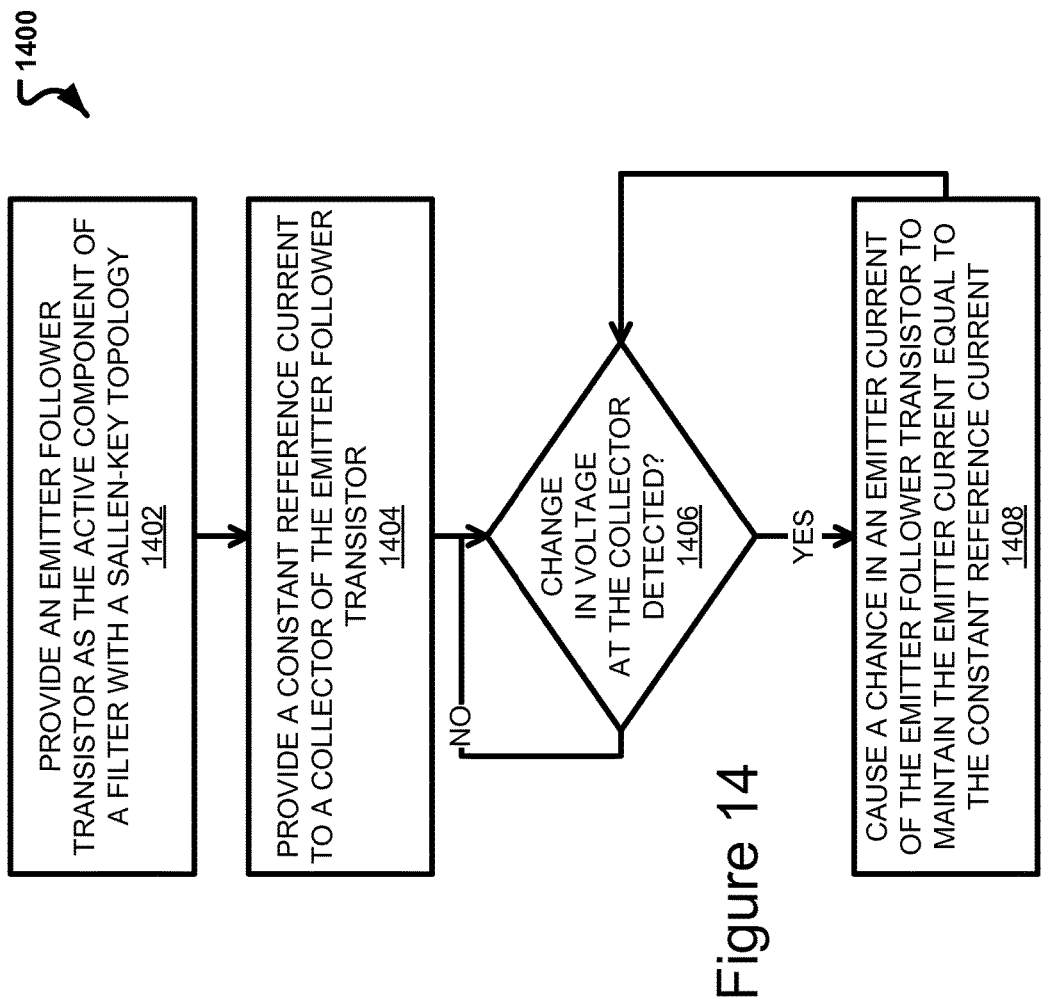
FIG. 14 is a flow diagram of a method of improving performance of the filter having a Sallen-Key topology, in accordance with various embodiments.

FIG. 14 is a flow diagram of a method 1400 of improving performance of the filter having a Sallen-Key topology, in accordance with various embodiments. While the operations of the method 1400 are arranged in a particular order in FIG.

14 and illustrated once each, in various embodiments, one or more of the operations may be repeated or performed concurrently, in accordance with the teachings of the present disclosure. Additionally, although the operations of the method 1400 may be illustrated with reference to the embodiment of FIG. 3, the method 1400 may be performed by any of the filter circuits 10 or multi-stage filters 1300 disclosed herein.

At 1402, an emitter follower transistor may be provided as the active component of a filter having a Sallen-Key topology. For example, the emitter follower transistor 16 may be provided as the active component of a filter circuit 10 having a Sallen-Key topology as illustrated in FIG. 3.

At 1404, a constant reference current may be provided to a collector of the emitter follower transistor provided at 1402. For example, a constant reference current may be provided by the current source 20 of the filter circuit 10 of FIG. 3 to the collector of the emitter follower transistor 16.

At 1406, it is determined whether a change in voltage at the collector of the emitter follower transistor (provided at 1402) has been detected. In some embodiments, the determination of 1506 may be performed by the current-buffering servo loop circuit 12. If no change has been detected, the method 1400 may return to 1406 and the voltage at the collector of the emitter follower transistor may continue to be monitored.

If a change in the voltage at the collector of the emitter follower transistor has been detected at 1406, the method 1400 may proceed to 1408 to cause a change in an emitter current of the emitter follower transistor (provided at 1402), by a current-buffering servo loop circuit, to maintain the emitter current equal to the constant reference current (provided at 1404). For example, if the current-buffering servo loop circuit 12 detects a change in the voltage at the collector of the emitter follower transistor 16 of FIG. 3 (1406), the current-buffering servo loop circuit 12 may cause a change in the emitter current of the emitter follower transistor 16 to maintain the emitter current (and the collector current) of the emitter follower transistor 16 equal to the constant reference current provided by the current source 20 (1408). In some embodiments, the current-buffering servo loop circuit 12 may cause the change in the emitter current by adjusting an amount of current sunk by the controlled current sink 23 coupled to the emitter of the emitter follower transistor 16.

In some embodiments, the method 1400 may further include providing a load current to a load coupled to the emitter of the emitter follower transistor (provided at 1402). In such embodiments, a change in voltage detected at 1406 may occur in response to provision of the load current (e.g., a change in the load current drawn by the load).

Figures 15, 16:
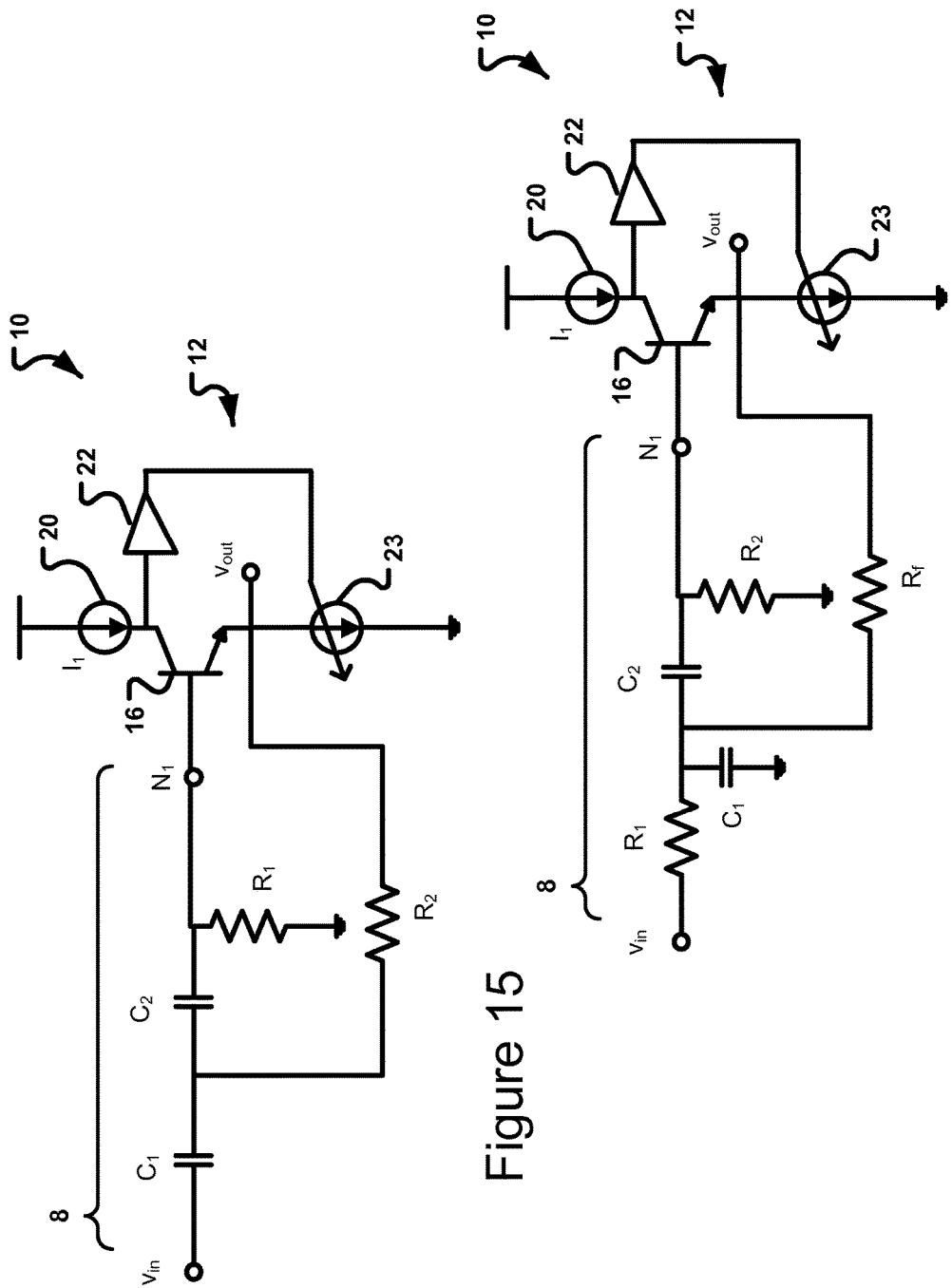
FIGS. 15 and 16 illustrate high-pass and bandpass filter circuits, respectively, having an emitter follower transistor and a servo loop circuit, in accordance with various embodiments.

The filter circuits 10 illustrated in FIGS. 3-12 are low-pass filters; however, this is simply for ease of illustration, and all of the teachings of the present disclosure may be applied to high-pass and bandpass filters. For example FIGS. 15 and 16 illustrate high-pass and bandpass topologies, respectively, implementing the teachings of the present disclosure. In particular, FIGS. 15 and 16 each illustrate a filter circuit 10 having an emitter follower transistor 16 and a current-buffering servo loop circuit 12, in accordance with various embodiments. The emitter follower transistor 16 may be coupled to a resistor-capacitor network 8 that includes various resistors and capacitors arranged as shown, and has an input to receive an input signal.

The resistor-capacitor network 8 of the filter circuits 10 of FIGS. 15 and 16 may have high-pass and bandpass Sallen-Key topologies, respectively, as illustrated and as known in the art. The values of the resistors and capacitors in the resistor-capacitor networks 8 of the filter circuits 10 of FIGS. 15 and 16 may be selected to achieve desired filter parameters as appropriate (such as the passband, roll off, etc.), as known in the art.

In FIGS. 15 and 16, the collector of the emitter follower transistor 16 may have a collector current, and the emitter of the emitter follower transistor 16 may have an emitter current. The filter circuits 10 may have an output $v_{out}$ to provide an output signal from the emitter of the emitter follower transistor 16. The filter circuits 10 may further include a current source 20 to provide a constant reference current $I_1$. As shown in FIGS. 15 and 16, the current source 20 may be coupled to the collector of the emitter follower transistor 16.

The current-buffering servo loop circuits 12 of FIGS. 15 and 16 may be coupled to the emitter follower transistor 16 and the current source 20. As shown in FIGS. 15 and 16, the current-buffering servo loop circuit 12 may be coupled to the current source 20 and the emitter of the emitter follower transistor 16. The current-buffering servo loop circuit 12 may include a current buffer 22 and a controlled current sink 23. The current buffer 22 may be coupled between the current source 20 and the controlled current sink 23, and the controlled current sink 23 may be coupled to the emitter of the emitter follower transistor 16. As discussed above with reference to FIG. 3, the servo loop circuits 12 of FIGS. 15 and 16 may be configured to maintain the collector current and emitter current of the emitter follower transistor 16 equal to the constant reference current provided by the current source 20, and may confer any one or more of the advantages of the current-buffering servo loop circuit 12 discussed above with reference to FIG. 3. Any of the embodiments of the filter circuit 10 of FIG. 3 discussed above with reference to FIGS. 4-12 may be implemented in the filter circuits 10 of FIGS. 15 and 16. The multi-stage filter 1300 of FIG. 13 may include the filter circuit 10 of FIG. 15 and/or FIG. 16 in any of the filter stages 1302, and the method 1400 of FIG. 14 may be performed by the filter circuits 10 of FIGS. 15 and 16.

In some embodiments of the filter circuit 10 of FIG. 3, an additional emitter follower transistor may be coupled between the $v_{out}$ terminal and the load (not shown in FIG. 3). This additional emitter follower transistor may be included to offset the voltage drop at the $v_{out}$ terminal that occurs due to the "diode drop" in voltage of the emitter follower transistor 16, and may also be configured with its own current-buffering servo loop circuit 12. For example, when the emitter follower transistor 16 is an NPN transistor, the voltage at the $v_{out}$ terminal may be reduced by one diode drop, and the additional emitter follower transistor may be a PNP transistor to bring the voltage presented to the load back up by one diode drop, thereby restoring the DC level. If the emitter follower transistor 16 is a PNP transistor, the additional emitter follower transistor may be an NPN transistor for analogous reasons. In analogous CMOS implementations, when the emitter follower transistor 16 is implemented as a source follower NMOS transistor, the additional transistor may be a source follower PMOS transistor, and vice versa. In general, the additional emitter follower transistor of the opposite polarity may be of the same type as the emitter follower transistor 16. In some multi-stage filter embodiments, the additional emitter follower transistor may be the emitter follower transistor of a subsequent filter stage. Such embodiments may advantageously take advantage of the restoration of the DC level shift and the additional filtering provided by the additional filter stage.

The following paragraphs provide examples of various ones of the embodiments disclosed herein.

Example 1 is a filter circuit, including: a resistor-capacitor network having an input to receive an input signal; an emitter follower transistor, coupled to the resistor-capacitor network, wherein a collector of the emitter follower transistor has a collector current, an emitter of the emitter follower transistor has an emitter current, and the filter circuit has an output to provide an output signal from the emitter of the emitter follower transistor; a current source to provide a constant reference current; and a current-buffering servo loop circuit, coupled to the emitter follower transistor and the current source, including a current buffer and a controlled current sink to maintain the collector current and the emitter current equal to the constant reference current.

Example 2 may include the subject matter of Example 1, and may further specify that the output signal is provided to a load that draws a load current from the filter circuit, and the current-buffering servo loop circuit is to maintain the collector current and the emitter current equal to the constant reference current as the load current is drawn.

Example 3 may include the subject matter of any of Examples 1-2, and may further specify that the controlled current sink includes a common emitter transistor.

Example 4 may include the subject matter of any of Examples 1-3, and may further specify that the current buffer includes an emitter follower buffer.

Example 5 may include the subject matter of Example 4, and may further specify that the emitter follower transistor is a first emitter follower transistor, and the emitter follower buffer includes a second emitter follower transistor coupled between the current source and a current sink.

Example 6 may include the subject matter of any of Examples 1-5, and may further specify that the controlled current sink is part of a current mirror.

Example 7 may include the subject matter of Example 6, and may further specify that the current mirror includes a pair of transistors having a common base, and further includes an additional transistor coupled between the common base and a collector of one of the transistors in the pair.

Example 8 may include the subject matter of any of Examples 1-7 and may further specify that the current-buffering servo loop circuit includes a cascode transistor coupled between the current source and the emitter follower transistor.

Example 9 may include the subject matter of any of Examples 1-8, and may further specify that the input signal is a first differential input signal, the output is a first differential output, the output signal is a first differential output signal, and the filter circuit further includes: a second resistor-capacitor network to receive a second differential input signal; a second emitter follower transistor, coupled to the second resistor-capacitor network, wherein a collector of the second emitter follower transistor has a second collector current, an emitter of the second emitter follower transistor has a second emitter current, and the filter circuit has a second differential output to provide a second differential output signal from the emitter of the second emitter follower transistor; a second current source to provide a second constant reference current; a second current-buffering servo loop circuit, coupled to the second emitter follower transistor and the second current source, including a second current buffer and a second controlled current sink to maintain the second collector current and the second emitter current equal to the second constant reference current; a first transistor having a base coupled to a base of the emitter follower transistor and having a collector coupled to the collector of the second emitter follower transistor; and a second transistor having a base coupled to a base of the second emitter follower transistor and having a collector coupled to the collector of the emitter follower transistor.

Example 10 may include the subject matter of any of Examples 1-9, and may further specify that the current-buffering servo loop circuit includes a voltage buffer.

Example 11 may include the subject matter of Example 10, and may further specify that the voltage buffer includes a common base transistor coupled between the current source and a current sink.

Example 12 may include the subject matter of Example 10, and may further specify that the emitter follower transistor is a first emitter follower transistor, and the current buffer includes a second emitter follower transistor coupled between the current source and the current sink.

Example 13 may include the subject matter of Example 12, and may further specify that a base of the second emitter follower transistor is coupled to the current source and an emitter of the second emitter follower transistor is coupled to an emitter of the common base transistor.

Example 14 may include the subject matter of Example 12, and may further specify that the current buffer further includes a capacitor coupled between the current source and the current sink.

Example 15 may include the subject matter of any of Examples 1-14, and may further specify that the filter circuit is a low-pass filter.

Example 16 may include the subject matter of any of Examples 1-14, and may further specify that the filter circuit is a high-pass or bandpass filter.

Example 17 is a multi-stage filter, including multiple filter stages coupled in series, wherein each filter stage includes: a resistor-capacitor network having an input to receive an input signal, an emitter follower transistor, coupled to the resistor-capacitor network, having an output to provide an output signal from an emitter of the emitter follower transistor, wherein a collector of the emitter follower transistor has a collector current and an emitter of the emitter follower transistor has an emitter current, a current source to provide a constant reference current, and a current-buffering servo loop circuit, coupled to the emitter follower transistor and the current source, including a current buffer and a controlled current sink to maintain the collector current and the emitter current equal to the constant reference current.

Example 18 may include the subject matter of Example 17, and may further specify that the resistor-capacitor network of a filter stage has a Sallen-Key topology.

Example 19 may include the subject matter of Example 18, and may further specify that the Sallen-Key topology is a unity-gain amplifier Sallen-Key topology.

Example 20 is a method of improving performance of a filter having a Sallen-Key topology, including: providing an emitter follower transistor as the active component of the filter; providing a constant reference current to a collector of the emitter follower transistor; detecting a change in a voltage at the collector; and in response to detecting the change, causing a change in an emitter current of the emitter follower transistor, by a current-buffering servo loop circuit, to maintain the emitter current equal to the constant reference current.

Example 21 may include the subject matter of Example 20, and may further include providing a load current to a load coupled to the emitter of the emitter follower transistor, wherein the change in voltage at the collector occurs in response to the provision of the load current.

Example 22 may include the subject matter of any of Examples 20-21, and may further specify that the constant reference current is provided to the collector of the emitter follower transistor via a cascode transistor.

Example 23 may include the subject matter of any of Examples 20-22, and may further specify that the filter is a filter stage in a series arrangement of multiple filter stages.

Example 24 may include the subject matter of any of Examples 20-23, and may further specify that causing a change in the emitter current includes adjusting an amount of current sunk by a controlled current sink coupled to an emitter of the emitter follower transistor.

Example 25 may include the subject matter of any of Examples 20-24, and may further specify that the change in the voltage at the collector is representative of a change in a collector current of the emitter follower transistor.

Example 26 is an apparatus including means for performing the method of any of Examples 20-25.

Example 27 may include the subject matter of Example 26, and may further specify that the apparatus is a low-pass filter.

Example 28 may include the subject matter of Example 26, and may further specify that the apparatus is a high-pass filter.

Example 29 may include the subject matter of Example 26, and may further specify that the apparatus is a bandpass filter.

Example 30 is a multi-stage filter, wherein at least one of the filter stages included in the multi-stage filter is implemented in accordance with any of Examples 1-16.

Example 31 is a computing device including any of the filter circuits of Examples 1-16.

What is claimed is:

1. A wideband filter circuit with local feedback, comprising:
    a resistor-capacitor network having an input to receive an input signal;
    an emitter follower transistor, coupled to the resistor-capacitor network, wherein a collector of the emitter follower transistor has a collector current, an emitter of the emitter follower transistor has an emitter current, and the filter circuit has an output to provide an output signal from the emitter of the emitter follower transistor;
    a current source to provide a constant reference current; and
    a current-buffering servo loop circuit, coupled to the emitter follower transistor and the current source, including a current buffer and a controlled current sink to maintain the collector current equal to the constant reference current and the emitter current equal to the constant reference current.

2. The filter circuit of claim 1, wherein the output signal is provided to a load that draws a load current from the filter circuit, and the current-buffering servo loop circuit is to maintain the collector current and the emitter current equal to the constant reference current as the load current is drawn.

3. The filter circuit of claim 1, wherein the controlled current sink includes a common emitter transistor.

4. The filter circuit of claim 1, wherein the current buffer includes an emitter follower buffer.

5. The filter circuit of claim 4, wherein the emitter follower transistor is a first emitter follower transistor, and the emitter follower buffer includes a second emitter follower transistor coupled between the current source and a current sink.

6. The filter circuit of claim 1, wherein the controlled current sink is part of a current mirror.

7. The filter circuit of claim 6, wherein the current mirror includes a pair of transistors having a common base, and further includes an additional transistor coupled between the common base and a collector of one of the transistors in the pair.

8. The filter circuit of claim 1, wherein the current-buffering servo loop circuit includes a cascode transistor coupled between the current source and the emitter follower transistor.

9. The filter circuit of claim 1, wherein the input signal is a first differential input signal, the output is a first differential output, the output signal is a first differential output signal, and the filter circuit further comprises:
    a second resistor-capacitor network to receive a second differential input signal;
    a second emitter follower transistor, coupled to the second resistor-capacitor network, wherein a collector of the second emitter follower transistor has a second collector current, an emitter of the second emitter follower transistor has a second emitter current, and the filter circuit has a second differential output to provide a second differential output signal from the emitter of the second emitter follower transistor;
    a second current source to provide a second constant reference current;
    a second current-buffering servo loop circuit, coupled to the second emitter follower transistor and the second current source, including a second current buffer and a second controlled current sink to maintain the second collector current and the second emitter current equal to the second constant reference current;
    a first transistor having a base coupled to a base of the emitter follower transistor and having a collector coupled to the collector of the second emitter follower transistor; and
    a second transistor having a base coupled to a base of the second emitter follower transistor and having a collector coupled to the collector of the emitter follower transistor.

10. The filter circuit of claim 1, wherein the current-buffering servo loop circuit includes a voltage buffer.

11. The filter circuit of claim 10, wherein the voltage buffer includes a common base transistor coupled between the current source and a current sink.

12. The filter circuit of claim 10, wherein the emitter follower transistor is a first emitter follower transistor, and the current buffer includes a second emitter follower transistor coupled between the current source and the current sink.

13. The filter circuit of claim 12, wherein a base of the second emitter follower transistor is coupled to the current source and an emitter of the second emitter follower transistor is coupled to an emitter of the common base transistor.

14. The filter circuit of claim 12, wherein the buffer further includes a capacitor coupled between the current source and the current sink.

15. The filter circuit of claim 1, wherein the filter circuit is a low-pass filter.

16. The filter circuit of claim 1, wherein the filter circuit is a high-pass or bandpass filter.

17. A wideband multi-stage filter having local feedback, comprising:
    multiple filter stages coupled in series, wherein each filter stage includes:

a resistor-capacitor network having an input to receive an input signal, an emitter follower transistor, coupled to the resistor-capacitor network, having an output to provide an output signal from an emitter of the emitter follower transistor, wherein a collector of the emitter follower transistor has a collector current and an emitter of the emitter follower transistor has an emitter current, a current source to provide a constant reference current, and a current-buffering servo loop circuit, coupled to the emitter follower transistor and the current source, including a current buffer and a controlled current sink to maintain the collector current equal to the constant reference current and the emitter current equal to the constant reference current.

18. The multi-stage filter of claim 17, wherein the resistor-capacitor network of a filter stage has a Sallen-Key topology.

19. The multi-stage filter of claim 18, wherein the Sallen-Key topology is a unity-gain amplifier Sallen-Key topology.

20. A method of improving performance of a filter having a Sallen-Key topology, comprising:

providing an emitter follower transistor as the active component of the filter;

providing a constant reference current to a collector of the emitter follower transistor;

detecting a change in a voltage at the collector; and in response to detecting the change, causing a change in an emitter current of the emitter follower transistor, by a current-buffering servo loop circuit, to maintain the emitter current equal to the constant reference current.

21. The method of claim 20, further comprising providing a load current to a load coupled to the emitter of the emitter follower transistor, wherein the change in voltage at the collector occurs in response to the provision of the load current.

22. The method of claim 20, wherein the constant reference current is provided to the collector of the emitter follower transistor via a cascode transistor.

23. The method of claim 20, wherein the filter is a filter stage in a series arrangement of multiple filter stages.

24. The method of claim 20, wherein causing a change in the emitter current comprises adjusting an amount of current sunk by a controlled current sink coupled to an emitter of the emitter follower transistor.

25. The method of claim 20, wherein the change in the voltage at the collector is representative of a change in a collector current of the emitter follower transistor.

* * * * *